(12) United States Patent
Liu et al.

(10) Patent No.: US 11,217,768 B2
(45) Date of Patent: Jan. 4, 2022

(54) ORGANIC LIGHT-EMITTING DISPLAY PANELS, METHODS FOR MAKING THE SAME, AND DISPLAY DEVICES

(71) Applicant: YUNGU (GU'AN) TECHNOLOGY CO., LTD., Langfang (CN)

(72) Inventors: Rusheng Liu, Kunshan (CN); Bo Yuan, Kunshan (CN); Genmao Huang, Kunshan (CN); Lin Xu, Kunshan (CN); Cuicui Sheng, Kunshan (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 0 days.

(21) Appl. No.: 16/734,429

(22) Filed: Jan. 6, 2020

(65) Prior Publication Data

US 2020/0144531 A1 May 7, 2020

Related U.S. Application Data

(63) Continuation of application No. PCT/CN2019/084861, filed on Apr. 28, 2019.

(30) Foreign Application Priority Data

Jul. 23, 2018 (CN) .......................... 201810813127.3

(51) Int. Cl.
*H01L 27/14* (2006.01)
*H01L 51/52* (2006.01)
*H01L 27/32* (2006.01)
*H01L 51/56* (2006.01)

(52) U.S. Cl.
CPC ........ *H01L 51/525* (2013.01); *H01L 27/3218* (2013.01); *H01L 51/56* (2013.01)

(58) Field of Classification Search
CPC ... H01L 27/3218; H01L 51/525; H01L 51/56; H01L 23/28; H01L 23/31; H01L 23/3157; H01L 23/3171; H01L 23/562
USPC .............................................. 257/43, 59, 72
See application file for complete search history.

(56) References Cited

U.S. PATENT DOCUMENTS

| | | | | |
|---|---|---|---|---|
| 8,711,469 | B2 * | 4/2014 | Yasui | .................... G02F 1/167 359/296 |
| 2007/0228937 | A1 | 10/2007 | Akiyoshi | |
| 2009/0058294 | A1 * | 3/2009 | Joo | ....................... H01L 51/525 313/512 |

(Continued)

FOREIGN PATENT DOCUMENTS

| CN | 101076842 A | 11/2007 |
|---|---|---|
| CN | 106876331 A * | 6/2017 |

(Continued)

OTHER PUBLICATIONS

Office Action of Chinese Patent Application No. 201810813127.3.
International Search Report of International Patent Application No. PCT/CN2019/084861.

*Primary Examiner* — Tan N Tran

(74) *Attorney, Agent, or Firm* — Kilpatrick Townsend & Stockton

(57) ABSTRACT

The present disclosure provides an organic light-emitting display panel, a method for making the same, and a display device including the same. The organic light-emitting display panel comprises an active region and a pixel spacer located within the active region, and the pixel spacer is provided with a buffer chamber.

17 Claims, 8 Drawing Sheets

(56) References Cited

U.S. PATENT DOCUMENTS

| | | | |
|---|---|---|---|
| 2013/0248867 A1* | 9/2013 | Kim | H01L 27/3246 257/59 |
| 2015/0144917 A1* | 5/2015 | Koo | H01L 51/5246 257/40 |
| 2016/0254476 A1 | 9/2016 | Park | |
| 2017/0207416 A1* | 7/2017 | Kim | H01L 51/5012 |
| 2018/0012944 A1 | 1/2018 | Gunji | |
| 2018/0301521 A1 | 10/2018 | Yang | |

FOREIGN PATENT DOCUMENTS

| | | |
|---|---|---|
| CN | 106876331 A | 6/2017 |
| CN | 106920826 A | 7/2017 |
| CN | 107068721 A | 8/2017 |
| CN | 206480628 U | 9/2017 |
| CN | 107611162 A | 1/2018 |
| CN | 206976349 U | 2/2018 |
| CN | 108962954 A | 12/2018 |

* cited by examiner

ORGANIC LIGHT-EMITTING DISPLAY PANELS, METHODS FOR MAKING THE SAME, AND DISPLAY DEVICES

CROSS-REFERENCES TO RELATED APPLICATIONS

This application claims all benefits accruing under 35 U.S.C. § 119 from China Patent Application No. 201810813127.3, filed on Jul. 23, 2018 in the State Intellectual Property Office of China, the content of which is hereby incorporated by reference. This application is a continuation under 35 U.S.C. § 120 of international patent application PCT/CN2019/084861 filed on Apr. 28, 2019, the content of which is also hereby incorporated by reference.

TECHNICAL FIELD

The present disclosure relates to the field of display technology, and particularly to organic light-emitting display panels, methods for making the same, and display devices.

BACKGROUND

A demand for a high quality of an organic light-emitting display panel is growing with the development of the display technology. However, the conventional organic light-emitting display panel tends to have display defects when subjected to an impact from a heavy object, which limits the practical application of the organic light-emitting display panel.

SUMMARY

The present disclosure provides an organic light-emitting display panel and a display device.

The organic light-emitting display panel includes an active region and a pixel spacer located within the active region. The pixel spacer defines a buffer chamber.

In an embodiment, the organic light-emitting display panel further includes a base substrate located at a side of the pixel spacer. The buffer chamber is located adjacent to the base substrate.

In an embodiment, the pixel spacer defines a plurality of the buffer chambers.

In an embodiment, a ratio of an area of a projection of the plurality of the buffer chambers on the base substrate to an area of a projection of the pixel spacer on the base substrate is in a range from about 1:1 to about 1:50.

In an embodiment, the organic light-emitting display panel further includes a plurality of sub-pixels. Each of the plurality of sub-pixels is surrounded by the pixel spacer. The plurality of the buffer chambers are provided between any two adjacent sub-pixels.

In an embodiment, upper ends of the plurality of the buffer chambers are coplanar with each other and lower ends of the plurality of the buffer chambers are coplanar with each other.

In an embodiment, at least two of the plurality of the buffer chambers are arranged along a direction perpendicular to a displaying surface of the organic light-emitting display panel.

In an embodiment, the buffer chamber has an arched, trapezoidal, circular, or rectangular cross-section perpendicular to an upper and/or lower surface of the pixel spacer.

In an embodiment, the organic light-emitting display panel includes a flexible filler or an inert gas filled in the buffer chamber.

In an embodiment, a material of the flexible filler is a silica gel or a liquid insulating material unable to react with a layer or a film surrounding the flexible filler.

In an embodiment, the inert gas is helium gas, or argon gas.

In an embodiment, the buffer chamber is an enclosed chamber.

In an embodiment, the buffer chamber is a chamber with an open end.

In an embodiment, the buffer chamber is arranged on a surface of the pixel spacer with a recess shape.

A method for making the organic light-emitting display panel is further provided. The method includes: preparing a pixel spacer within an active region of the organic light-emitting display panel; and forming a buffer chamber on the pixel spacer.

In an embodiment, the preparing the pixel spacer and the forming the buffer chamber on the pixel spacer include: providing a substrate; forming a patterned embankment on the substrate within the active region thereby obtaining a substrate formed with the patterned embankment; forming the pixel spacer on the substrate formed with the patterned embankment; and removing the embankment to form the buffer chamber.

The display device includes the organic light-emitting display panel.

By using the organic light-emitting display panel provided in the present disclosure, since a buffer chamber is formed in the pixel spacer, if a region of the organic light-emitting display panel provided with the buffer chamber is struck by a heavy object, a route along which the stress is transferred downward would be cut off by the buffer chamber, so that the stress would tend to be dissipated in other directions, thereby avoiding the damage of a functional layer located under the pixel spacer caused by the stress concentration and avoiding the display defects and failure.

BRIEF DESCRIPTION OF THE DRAWINGS

Implementations are described by way of example only with reference to the attached figures.

DETAILED DESCRIPTION OF THE INVENTION

For a clear understanding of the technical features, objects and effects of the present disclosure, specific embodiments of the present disclosure will now be described in detail with reference to the accompanying drawings. It is to be understood that the following description is merely exemplary embodiments of the present disclosure, and is not intended to limit the scope of the present disclosure.

A reliability of a flexible display product is a main factor affecting the product yield. In a reliability test, when a ball having a weight of 32.65 g and a diameter of 20 mm is dropped from a height of 2 cm to 62.5 cm to strike a screen of a known flexible display product, a display defect, such as a black spot, a bright spot, and/or a color spot, occurs immediately on the area struck by the ball, revealing that the reliability of the known flexible display product does not satisfy the requirements of the practical application.

If an organic light-emitting display panel is subjected to a drop impact, a stress would tend to be concentrated at the struck area and transferred downward immediately along a pixel spacer, which would cause a damage of an anode of the organic light-emitting display panel located under the pixel spacer. Therefore, the pixel spacer has an important role in achieving an impact resistance of the organic light-emitting display panel.

The present disclosure provides an organic light-emitting display panel and a display device capable of avoiding the display defects and failure when struck by a heavy object.

The organic light-emitting display panel of the present disclosure includes an active region and a pixel spacer located within the active region. The pixel spacer defines a buffer chamber.

The organic light-emitting display panel can be an organic light-emitting diodes (OLED) display panel and so on. In an embodiment, the organic light-emitting display panel can be a flexible display panel.

In the present disclosure, if a region of the organic light-emitting display panel provided with the buffer chamber is struck by a heavy object, a route along which the stress is transferred downward is cut off by the buffer chamber, so that the stress would tend to be dissipated in other directions, thereby avoiding the damage of a functional layer located under the pixel spacer caused by the stress concentration and avoiding the display defects and failure. Furthermore, the reliability and the bending strength of the organic light-emitting display panel can be enhanced.

Figure 1:
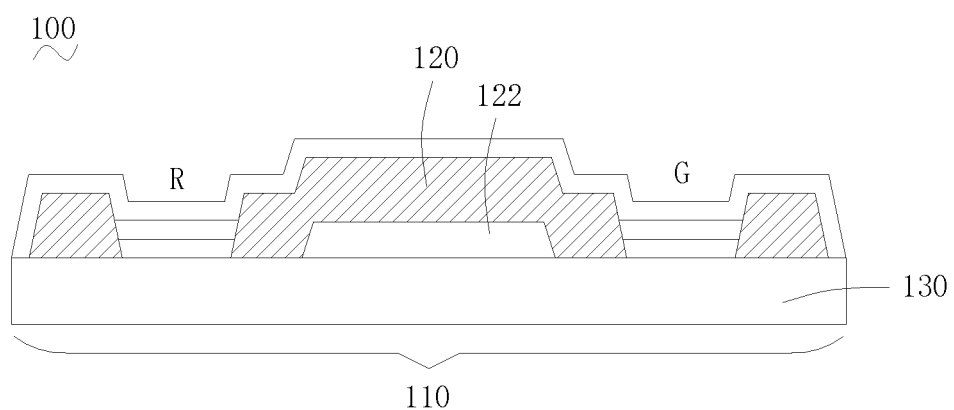
FIG. 1 is a schematic sectional view of an organic light-emitting display panel according to one embodiment of the present disclosure.

Referring to FIG. 1, an organic light-emitting display panel 100 provided in an embodiment of the present disclosure includes an active region 110 and a pixel spacer 120 located within the active region 110. The pixel spacer 120 defines a buffer chamber 122.

The active region 110 refers to a region, in addition to a frame, of the organic light-emitting display panel 100 configured for displaying images. In addition to the active region 110, the organic light-emitting display panel 100 can also include a frame region (i.e. a non-active region, not shown) surrounding the active region 110.

The pixel spacer 120 can also be referred as a pixel-isolating pillar or a pixel-defining layer. The pixel spacer 120 surrounds a sub-pixel to define the location of the sub-pixel. The sub-pixel can be a red sub-pixel, a green sub-pixel, a blue sub-pixel, and so on.

The buffer chamber 122 can be an enclosed chamber. For example, the buffer chamber 122 can be defined inside the pixel spacer 120. The buffer chamber 122 can also be a chamber with an open end. For example, the buffer chamber 122 can be arranged on a surface of the pixel spacer 120 with a recess shape.

The organic light-emitting display panel 100 can further include a base substrate 130 located at a side of the organic light-emitting. The buffer chamber 122 can be located adjacent to the base substrate 130, as shown in FIG. 1. The base substrate 130 is configured to support the functional layer formed thereon. The base substrate 130 can be a flexible base substrate made of a flexible material, such as polyimide (PI). In an embodiment, the base substrate 130 itself can further include the functional layer, such as a buffer layer and a blocking layer.

When the buffer chamber 122 is located adjacent to the base substrate 130, a region of the pixel spacer 120 located around the buffer chamber 122 can have a bridge shape. When a force is applied to anywhere on the region of the bridge shaped pixel spacer 120, a stress caused by the force can be dissipated in all directions rapidly, thereby effectively avoiding the damage of the function layer located under the pixel spacer 120 caused by the stress concentration and effectively avoiding the display defects and failure.

Figure 2:
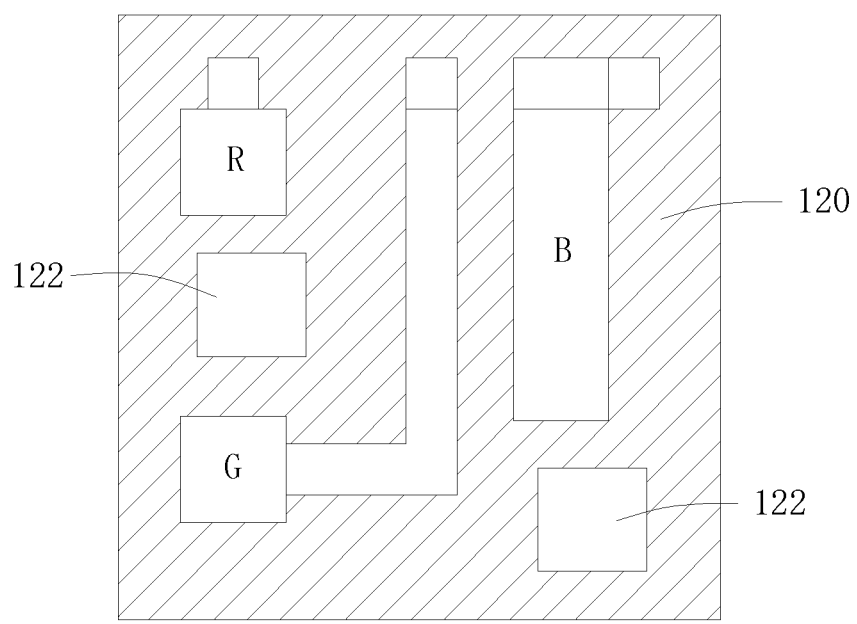
FIG. 2 is a schematic top view of the organic light-emitting display panel according to one embodiment of the present disclosure.

Referring to FIG. 2, the pixel spacer 120 can define a plurality of buffer chambers 122. A ratio of an area of a projection of the plurality of buffer chambers 122 on the base substrate 130 to an area of a projection of the pixel spacer 120 on the base substrate 130 can be in a range from about 1:1 to about 1:50, such that the organic light-emitting display panel 100 can be fully protected by the buffer chambers 122. When the organic light-emitting display panel 100 is struck by a heavy object, the stress concentration can be substantially reduced, thereby avoiding the damage of the functional layer located under the pixel spacer 120 and avoiding the display defects and failure.

The plurality of buffer chambers 122 can be uniformly distributed on the pixel spacer 120. Uniform distribution means that distances between any two adjacent buffer chambers 122 can be substantially the same, although there might be a minor difference between the distances. Since the plurality of buffer chambers 122 are uniformly distributed on the pixel spacer 120, the organic light-emitting display panel 100 can be fully protected by the buffer chambers 122. When the organic light-emitting display panel 100 is struck by a heavy object, the stress concentration can be substantially reduced, thereby avoiding the damage of the functional layer located under the pixel spacer 120 and avoiding the display defects and failure.

In an embodiment, the pixel spacer 120 is provided with a plurality of buffer chambers 122, and a ratio of an area of a projection of the plurality of buffer chambers 122 on the base substrate 130 to an area of a projection of the pixel spacer 120 on the base substrate 130 can be in a range from about 1:1 to about 1:50. As such, the stress concentration can be reduced to a greatest extent via the plurality of buffer chambers 122.

It should be noted that one, two, or more buffer chambers can be provided on the pixel spacer 120 between any two adjacent sub-pixels in the organic light-emitting display panel.

Figure 3:
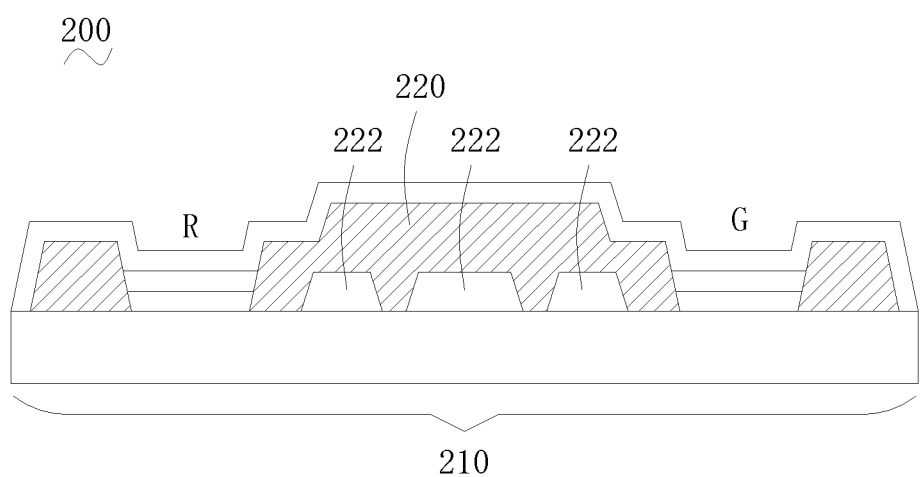
FIG. 3 is a schematic sectional view of an organic light-emitting display panel according to another embodiment of the present disclosure.

Referring to FIG. 3, an organic light-emitting display panel 200 provided in another embodiment of the present disclosure includes an active region 210 and a pixel spacer 220 located within an active region 210. The pixel spacer 220 defines a buffer chamber 222.

The organic light-emitting display panel 200 includes a plurality of sub-pixels (such as a red sub-pixel and a green sub-pixel as shown in FIG. 3). Each of the plurality of sub-pixels can be surrounded by the pixel spacer 220. A plurality of buffer chambers 222, for example, three buffer chambers 222, can be defined by the pixel spacer 220 between any two adjacent sub-pixels, so that the stress can be dissipated in all directions via more paths so as to be dissipated relatively fast to effectively avoid the display defects and failure when the organic light-emitting display panel is struck by a heavy object.

A number of the buffer chambers between two adjacent sub-pixels can be different from a number of the buffer chambers between another two adjacent sub-pixels. In an embodiment, more buffer chambers can be defined at the location where larger stress would be caused by striking, and less buffer chambers can be defined at the location where smaller stress would be caused by striking.

It should be noted that the dimensions of the plurality of buffer chambers can be the same or different in the organic light-emitting display panel provided in the present disclosure.

In an embodiment, lower ends of the plurality of buffer chambers 222 are coplanar with each other, and upper ends of the plurality of buffer chambers 222 are coplanar with each other. As such, a method for forming the plurality of buffer chambers 222 is simple and easy to be implemented. It should be understood that the locations of the plurality of buffer chambers in the present disclosure is not limited to the embodiments as described above.

Figure 4:
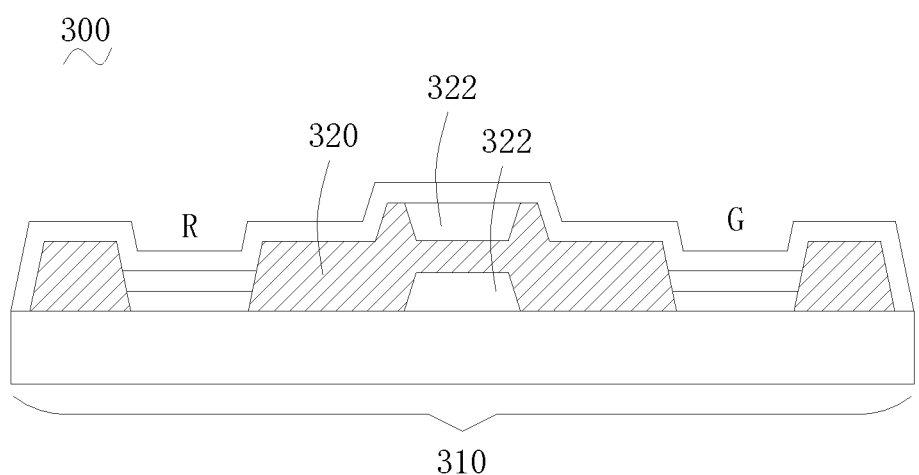
FIG. 4 is a schematic sectional view of an organic light-emitting display panel according to another embodiment of the present disclosure.

Referring to FIG. 4, an organic light-emitting display panel 300 provided in another embodiment of the present disclosure includes an active region 310 and a pixel spacer 320 located within the active region 310. The pixel spacer 320 defines a plurality of buffer chambers 322. At least two buffer chambers 322 can be arranged along a longitudinal direction. In the present disclosure, the longitudinal direction refers to a direction perpendicular to a displaying surface of an organic light-emitting display panel.

If a region of the organic light-emitting display panel 300 provided with the at least two buffer chambers 322 is struck by a heavy object, then the buffer chamber 322 located at a side of the pixel spacer 320 adjacent to the displaying surface can increase an area of the organic light-emitting display panel 300 in contact with the heavy object so as to decrease the intensity of pressure applied on the organic light-emitting display panel 300. Furthermore, the buffer chamber 322 located at a side of the pixel spacer 320 away from the displaying surface can cut off the route along which the stress is transferred downward, so that the stress would tend to be dissipated in other directions, thereby avoiding the damage of the functional layer located under the buffer chamber 322 caused by the stress concentration. As such, the display defects and failure are avoided.

In the above-described embodiments, the buffer chamber can have a trapezoidal cross-section perpendicular to the upper surface and/or the lower surface of the pixel spacer. It should be understood that the cross-section of the buffer chamber perpendicular to the upper surface and/or the lower surface of the pixel spacer can also has other shapes, such as an arched shape, a circular shape, an oval shape, a rectangular shape, a triangular shape, and so on, which is not limited herein.

Figure 5:
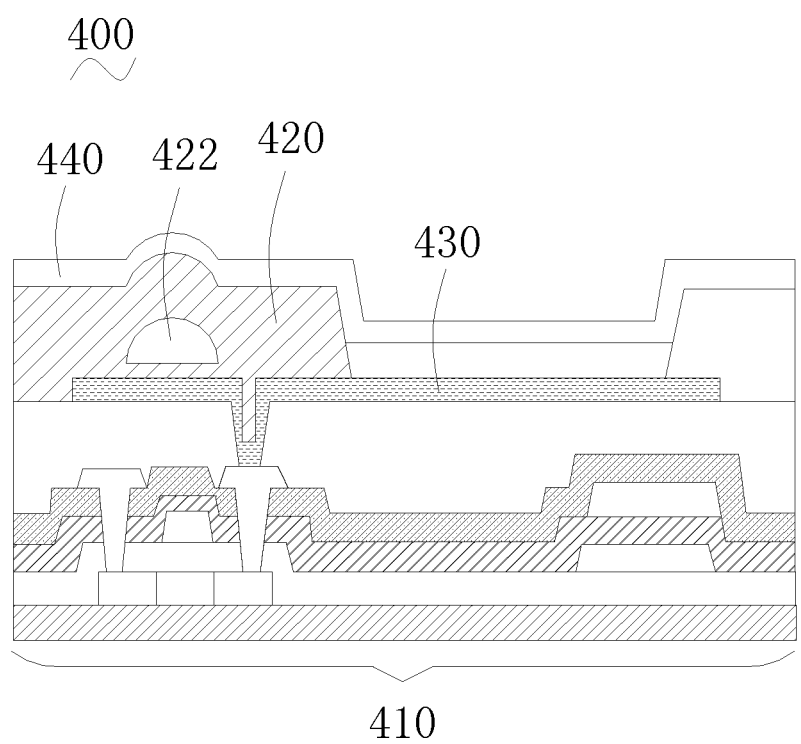
FIG. 5 is a schematic sectional view of an organic light-emitting display panel according to another embodiment of the present disclosure.

Referring to FIG. 5, an organic light-emitting display panel 400 provided in another embodiment of the present disclosure includes an active region 410 and a pixel spacer 420 located within the active region 410. The organic light-emitting display panel 400 further includes a cathode 440 located above the pixel spacer 420 and an anode 430 located under the pixel spacer 420.

The pixel spacer 420 is provided with a plurality of buffer chambers 422. The buffer chamber 422 has an arched cross-section perpendicular to the upper surface and/or the lower surface of the pixel spacer 420, as shown in FIG. 5. When a force is applied to a region of the organic light-emitting display panel 400 located above the arched buffer chamber 422, the stress can be dissipated in all directions rapidly, thereby avoiding the damage of the anode 430 located under the buffer chamber 422 caused by the stress concentration and effectively avoiding the display defects and failure.

In an embodiment, the buffer chamber can be filled with a flexible filler (not shown) or an inert gas. The flexible filler or the inert gas acts as a buffer to reduce the stress squeezing the functional layer located under the buffer chamber when the region of the organic light-emitting display panel provided with the buffer chamber is subjected to a force. The inert gas can include helium gas, argon gas, or other inert gases.

The flexible filler can be made of a silica gel or a liquid insulating material unable to react with a layer or film surrounding the flexible filler. Both of the silica gel and the liquid insulating material have a good buffering effect. It should be understood that the material of the flexible filler is not limited herein as long as the material has a good buffering effect.

By using the organic light-emitting display panel provided in the present disclosure, when a region of the organic light-emitting display panel provided with the buffer chamber is struck by a heavy object, a route along which the stress is transferred downward would be cut off by the buffer chamber, so that the stress would tend to be dissipated in other directions, thereby avoiding the damage of a functional layer located under the pixel spacer caused by the stress concentration and avoiding the display defects and failure.

A method for making the organic light-emitting display panel is further provided in the present disclosure. The method includes a step of forming the buffer chamber on the pixel spacer within the active region to obtain the organic light-emitting display panel.

In one embodiment, the step of forming the buffer chamber on the pixel spacer within the active region includes steps of:

S10, forming a patterned embankment on a substrate within the active region, thereby obtaining a substrate formed with the patterned embankment.

S20, forming the pixel spacer on the substrate formed with the patterned embankment; and S30, removing the embankment to form the buffer chamber, so as to obtain the organic light-emitting display panel.

In the S10, the substrate is configured to support the patterned embankment. The other functions and the structure of the substrate are not limited herein. In an embodiment, the substrate can be the functional layer of the organic light-emitting display panel which is to be located under the subsequently formed pixel spacer, so that the buffer chamber formed in the subsequent step is arranged on the surface of the pixel spacer. In another embodiment, the substrate can be a portion of the pixel spacer, the patterned embankment can be formed on the portion of the pixel spacer, and another portion of the pixel spacer can be formed on the patterned embankment, so that the buffer chamber formed in the subsequent step is located inside the pixel spacer.

Figure 6:
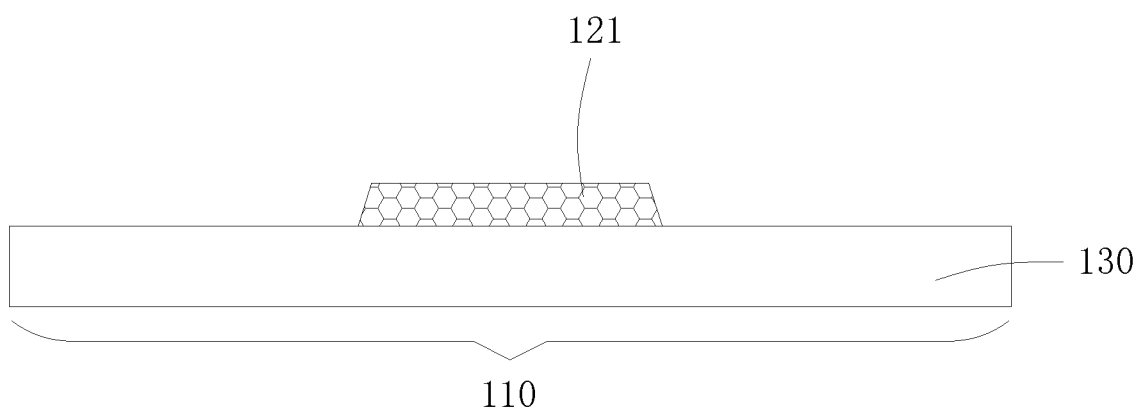
FIG. 6 is a schematic sectional view of a substrate formed with an embankment in a method for making an organic light-emitting display panel according to one embodiment of the present disclosure.

Referring to FIG. 6, in an embodiment, the substrate is the base substrate 130. A patterned embankment 121 is formed on the base substrate 130 within the active region 110. The embankment 121 is configured for forming the buffer chamber in the subsequent step. The region where the embankment 121 is located at is the region where the buffer chamber is to be located at. The subsequently formed buffer chamber has the same dimension as the embankment 121.

The embankment 121 can be made of an inorganic compound, such as silicon oxide, silicon nitride, and so on. The patterned embankment 121 can be prepared by means of wet etching, high selectivity dry etching, and as on.

Figure 7:
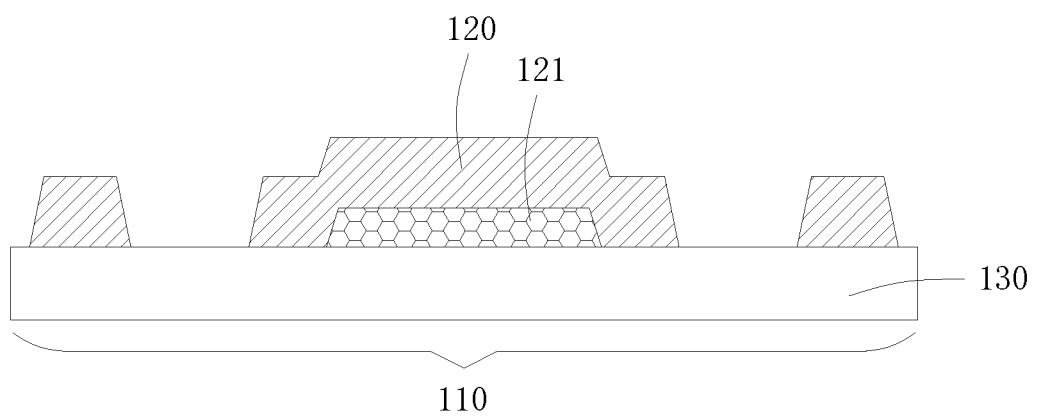
FIG. 7 is a schematic sectional view of the substrate formed with the embankment and a pixel spacer in the method for making the organic light-emitting display panel according to one embodiment of the present disclosure.

In the S20, a continuous layer of pixel spacer precursor can be formed on the substrate formed with the patterned embankment 121 by a method such as coating. Then the continuous layer of pixel spacer precursor is patterned (for example, by etching) to form the pixel spacer 120 covered on the embankment 121, as shown in FIG. 7.

Figure 8:
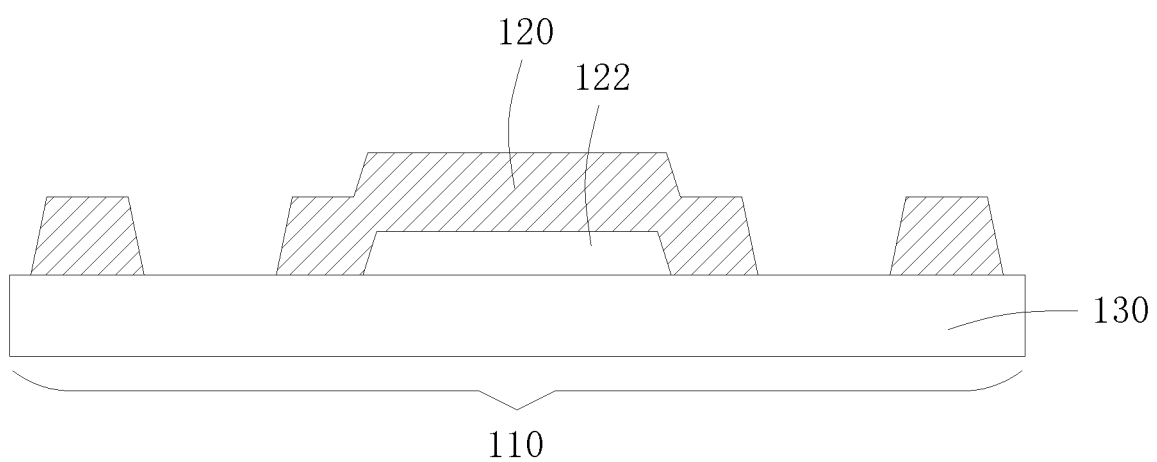
FIG. 8 is a schematic sectional view of the substrate formed with the pixel spacer and a buffer chamber in the method for making the organic light-emitting display panel according to one embodiment of the present disclosure.

In the S30, the embankment 121 located under the pixel spacer 120 can be removed by etching method. In an embodiment, a through hole can be formed on the pixel spacer 120 to expose the embankment 121 located under the pixel spacer 120, then an etching solution can be in contact with the embankment 121 via the through hole to etch the embankment 121 until the embankment 121 is completely removed, so as to form the buffer chamber 122, as shown in FIG. 8. Other layers, such as a light-emitting layer and a cathode, if required, can be formed on the pixel spacer 120 to form the organic light-emitting display panel as shown in FIG. 1. The flexible filler, if required, can also be filled into the buffer chamber 122 via the through hole.

It should be understood that other methods and processes can also be applied to make the organic light-emitting display panel provided with the buffer chamber. For example, the embankment can be made of a material which can be decomposed under light (any kind of light, such as ultraviolet light). After the pixel spacer 120 is formed, the embankment can be exposed to the light to be removed, thereby forming the buffer chamber.

In the embodiment as shown in FIG. 8, in the organic light-emitting display panel made by the above method, the buffer chamber 122 is defined by the lower surface of the pixel spacer 120 and is located adjacent to the base substrate 130.

It should be understood that the location of the buffer chamber 122 in the organic light-emitting display panel of the present disclosure is not limited thereto. For example, the buffer chamber 122 can also be defined by the upper surface of the pixel spacer 120, in this case, a pixel spacer precursor can be formed firstly, and then a buffer chamber can be formed on the upper surface of the pixel spacer 120 by imprinting or etching the pixel spacer precursor.

By using the method for making the organic light-emitting display panel provided in the present disclosure, since a buffer chamber is defined in the pixel spacer, when a region of the organic light-emitting display panel provided with the buffer chamber is struck by a heavy object, a route along which the stress is transferred downward would be cut off by the buffer chamber, so that the stress would tend to be dissipated in other directions, thereby avoiding the damage of a functional layer located under the pixel spacer caused by the stress concentration and avoiding the display defects and failure.

A display device is further provided in the present disclosure. The display device includes the organic light-emitting display panel provided in any one of the above described embodiments.

By using the display device provided in the present disclosure, when a region of the organic light-emitting display panel provided with the buffer chamber is struck by a heavy object, a route along which the stress is transferred downward would be cut off by the buffer chamber, so that the stress would tend to be dissipated in other directions, thereby avoiding the damage of a functional layer located under the pixel spacer caused by the stress concentration and avoiding the display defects and failure.

The technical features of the above-described embodiments may be arbitrarily combined. In order to make the description simple, not all possible combinations of the technical features in the above embodiments are described. However, as long as there is no contradiction in the combination of these technical features, the combinations should be in the scope of the present application.

What described above are only several implementations of the present application, and these embodiments are specific and detailed, but not intended to limit the scope of the present application. It should be understood by the skilled in the art that various modifications and improvements can be made without departing from the conception of the present application, and all fall within the protection scope of the present application. Therefore, the patent protection scope of the present application is defined by the appended claims.

The invention claimed is:

1. An organic light-emitting display panel, comprising: an active region, and
a pixel spacer located within the active region, wherein the pixel spacer defines a plurality of buffer chambers, the plurality of the buffer chambers including a first buffer chamber, the pixel spacer configured to overlay a first top surface of the first buffer chamber completely and define the first buffer chamber, wherein the first buffer chamber is an enclosed volume defined by one or more of the pixel spacer and a base substrate, and wherein at least two of the plurality of the buffer chambers, including the first buffer chamber, are arranged along a direction perpendicular to a displaying surface of the organic light-emitting display panel.

2. The organic light-emitting display panel of claim 1, further comprising the base substrate located at a side of the pixel spacer, wherein the first buffer chamber is located adjacent to the base substrate.

3. The organic light-emitting display panel of claim 2, wherein a ratio of an area of a projection of the plurality of the buffer chambers on the base substrate to an area of a projection of the pixel spacer on the base substrate is in a range from 1:1 to 1:50.

4. The organic light-emitting display panel of claim 1, further comprising a plurality of sub-pixels;
wherein each of the plurality of sub-pixels is surrounded by the pixel spacer, and the plurality of the buffer chambers are located between any two adjacent sub-pixels.

5. The organic light-emitting display panel of claim 4, wherein upper ends of the plurality of the buffer chambers are coplanar with each other, and lower ends of the plurality of the buffer chambers are coplanar with each other.

6. The organic light-emitting display panel of claim 1, wherein the plurality of the buffer chambers include an arched, trapezoidal, circular, or rectangular cross-section perpendicular to an upper surface of the pixel spacer.

7. The organic light-emitting display panel of claim 1, comprising a flexible filler or an inert gas filled in the plurality of the buffer chambers, the plurality of the buffer chambers being configured outside display pixels.

8. The organic light-emitting display panel of claim 7, wherein a material of the flexible filler is a silica gel or a liquid insulating material unable to react with a layer or a film surrounding the flexible filler.

9. The organic light-emitting display panel of claim 7, wherein the inert gas is helium gas, argon gas, or a combination thereof.

10. The organic light-emitting display panel of claim 1, wherein the plurality of the buffer chambers are enclosed within the pixel spacer.

11. The organic light-emitting display panel of claim 1, wherein the plurality of the buffer chambers includes a chamber with an open end, wherein at least part of the chamber with the open end is not defined by the pixel spacer.

12. The organic light-emitting display panel of claim 11, wherein the plurality of the buffer chambers are arranged on a surface of the pixel spacer and has a recess shape.

13. The organic light-emitting display panel of claim 1, wherein a region of the pixel spacer located around the first buffer chamber has a bridge shape.

14. The organic light-emitting display panel of claim 1 wherein the plurality of buffer chambers further comprises a second buffer chamber, the second buffer chamber aligned relative to the first buffer chamber, the pixel spacer overlaying a bottom surface of the second buffer chamber.

15. The organic light-emitting display panel of claim 1 wherein the plurality of buffer chambers further comprises a second buffer chamber, the second buffer chamber aligned relative to the first buffer chamber, the pixel spacer overlaying a second top surface of the second buffer chamber.

16. A method for making an organic light-emitting display panel, comprising:
   forming a patterned embankment on a substrate within an active region of the organic light-emitting display;
   forming a pixel spacer on the substrate formed with the patterned embankment, wherein the pixel spacer is within the active region of the organic light-emitting display panel; and
   forming a buffer chamber on the pixel spacer, wherein forming the buffer chamber further comprises removing a portion of the patterned embankment to form the buffer chamber, a top surface of the buffer chamber being covered completely and defined by the pixel spacer, wherein the buffer chamber is an enclosed volume defined by one or more of the pixel spacer and a base substrate.

17. A display device, comprising an organic light-emitting display panel, wherein the organic light-emitting display panel comprises an active region and a pixel spacer located within the active region, wherein the pixel spacer defines a plurality of buffer chambers, the plurality of buffer chambers including a first buffer chamber, the pixel spacer configured to overlay a first top surface of the first buffer chamber completely and define the first buffer chamber, wherein the first buffer chamber is an enclosed volume defined by one or more of the pixel spacer and a base substrate, and wherein at least two of the plurality of buffer chambers, including the first buffer chamber, are arranged along a direction perpendicular to a displaying surface of the organic light-emitting display panel.

* * * * *